United States Patent
Dimitrov et al.

(10) Patent No.: US 9,099,109 B2
(45) Date of Patent: Aug. 4, 2015

(54) MAGNETIC STACK WITH DIFFERENT AREAL EXTENTS ON AN AIR BEARING SURFACE

(71) Applicant: Seagate Technology LLC, Cupertino, CA (US)

(72) Inventors: Dimitar Velikov Dimitrov, Edina, MN (US); Dian Song, Eden Prairie, MN (US); Mark Thomas Kief, Lakeville, MN (US); Sung-Hoon Gee, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/019,278

(22) Filed: Sep. 5, 2013

(65) Prior Publication Data

US 2015/0062757 A1 Mar. 5, 2015

(51) Int. Cl.
*G11B 5/31* (2006.01)

(52) U.S. Cl.
CPC .................................. *G11B 5/3116* (2013.01)

(58) Field of Classification Search
CPC ...................... G11B 5/3912; G11B 2005/3996; G11B 5/11; G11B 5/39; G11B 5/3116

USPC ............ 360/324, 324.1, 324.11, 324.12, 319, 360/235.4

See application file for complete search history.

(56) References Cited

U.S. PATENT DOCUMENTS

| | | | |
|---|---|---|---|
| 7,499,249 B2 | 3/2009 | Ide et al. | |
| 7,602,591 B2 | 10/2009 | Sbiaa et al. | |
| 7,724,481 B2 | 5/2010 | Ide et al. | |
| 8,749,926 B1 * | 6/2014 | Le et al. | 360/324.12 |
| 8,842,396 B1 * | 9/2014 | Zhu | 360/324.12 |
| 8,896,974 B2 * | 11/2014 | Kawasaki et al. | 360/324.12 |
| 2007/0115596 A1 | 5/2007 | Nakabayashi et al. | |
| 2008/0002310 A1 * | 1/2008 | Cyrille et al. | 360/324.12 |
| 2009/0257153 A1 * | 10/2009 | Liu | 360/324.12 |
| 2011/0051291 A1 * | 3/2011 | Miyauchi et al. | 360/245.3 |
| 2011/0273802 A1 | 11/2011 | Zhou et al. | |
| 2013/0015543 A1 | 1/2013 | Gao et al. | |

* cited by examiner

Primary Examiner — Angel Castro
(74) Attorney, Agent, or Firm — Hall Estill Attorneys at Law

(57) ABSTRACT

A data reader may be configured at least with a magnetic stack that has a first magnetic layer separated from a second magnetic layer by a non-magnetic spacer layer. The first magnetic layer may have an areal extent on an air bearing surface (ABS) that differs from the second magnetic layer while the second magnetic layer can be configured with a first plurality of linear sidewalls that are each angled with respect to a second plurality of linear sidewalls of the first magnetic layer.

20 Claims, 4 Drawing Sheets

MAGNETIC STACK WITH DIFFERENT AREAL EXTENTS ON AN AIR BEARING SURFACE

SUMMARY

Assorted embodiments configure a data reader as a magnetic stack that has a first magnetic layer separated from a second magnetic layer by a non-magnetic spacer layer. The first magnetic layer having an areal extent on an air bearing surface (ABS) that differs from the second magnetic layer while the second magnetic layer is configured with a first plurality of linear sidewalls that are each angled with respect to a second plurality of linear sidewalls of the first magnetic layer

DETAILED DESCRIPTION

Continued consumer and industry goals for larger data capacity and faster data access in reduced form factor data storage devices has emphasized the linear data bit density resolution of a data reading component, such as a transducer. Although reducing the physical size of a data reading component can slim pulse width and increase linear data bit density resolution, decreasing the physical size of magnetic layers has become progressively more difficult as the magnetic characteristics of minimized layers are more volatile and less accurate. Such volatility can degrade performance in a data storage device by hindering signal-to-noise ratio. Thusly, increasing magnetic integrity in reduced form factor magnetic layers has been experienced heightened attention of academia and industry recently.

These issues have rendered a magnetic stack having a first magnetic layer separated from a second magnetic layer by a non-magnetic spacer layer, the first magnetic layer having an areal extent on an air bearing surface (ABS) that differs from the second magnetic layer when the second magnetic layer is configured with a first plurality of linear sidewalls each angled with respect to a second plurality of linear sidewalls of the first magnetic layer. The ability to tune the angle of each of the second plurality of linear sidewalls can reduce the amount of side milling undertaken during manufacturing, which can degrade performance by altering magnetization strength and orientation that impacts signal-to-noise ratio. More specifically, side milling a magnetic layer and coupling seed layer to form a sidewall parallel with the longitudinal axis of the magnetic stack during data reader fabrication can cause the magnetization of the layers to inadvertently rotate and maintain an unwanted magnetic state that corresponds with pulse distortion and instability during operation.

Figure 1:
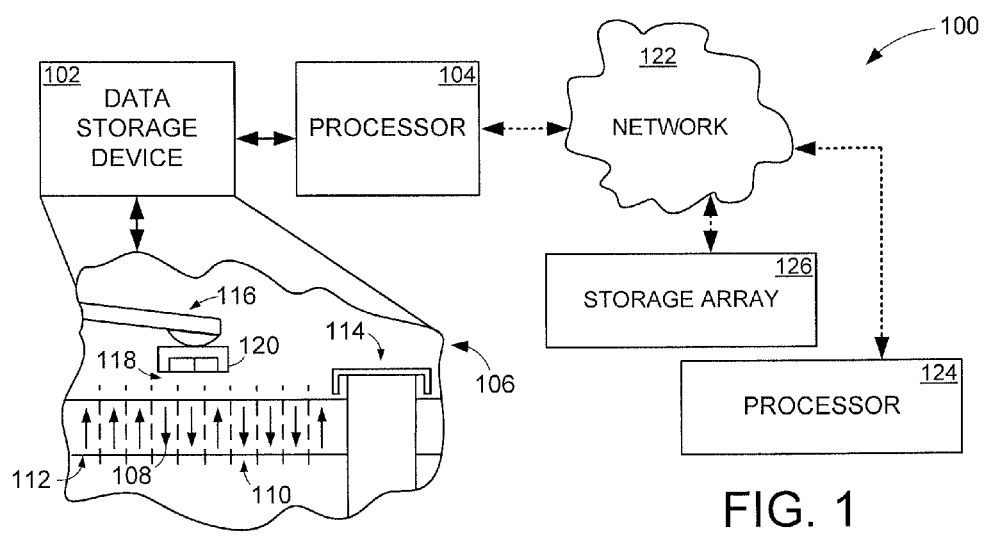
FIG. 1 is a block representation of a portion of an example data storage system configured in accordance with some embodiments.

A non-limiting data storage environment in which a magnetic stack with tuned sidewall angles at the ABS can be practiced is generally shown by the data storage system 100 of FIG. 1. In accordance with various embodiments, the data storage system 100 can have one or more data storage devices 102 individually or collectively connected to at least one local processor 104. A data storage device 102 may comprise any number of data bit storage and retrieval capabilities in a wide variety of different computing environments, such as in a redundant array of independent discs (RAID) or cloud computing environment. One or more data storage devices 102 can be configured with a data transducing assembly 106 where a plurality of magnetic data bits 108 can be arranged in data tracks 110 on a data medium 112 that is controlled by a centrally positioned spindle motor 114.

An actuating assembly 116 can be configured to float a predetermined distance above the data bits 108 and data medium 112 on an air bearing 118. The actuating assembly 116 can have at least one transducing head 120 suspended on a gimbal that allows one or more transducing means to pitch and roll to access selected data bits 108 from one or more tracks 110. In this way, the local processor 104 can dictate data access to and from the data medium 112 by spinning the spindle motor 114 and articulating the actuating assembly 116. It should be noted that control of the data transducing assembly 106 is not limited to the local processor 104 as various remote computing components can utilize the transducing assembly 106 across a network 122 via appropriate communications protocol. As a non-limiting example, a remote processor 124 and memory array 126 can operate independently or in conjunction with the local processor 104 to write and read data to and from the data medium 112.

Figure 2:
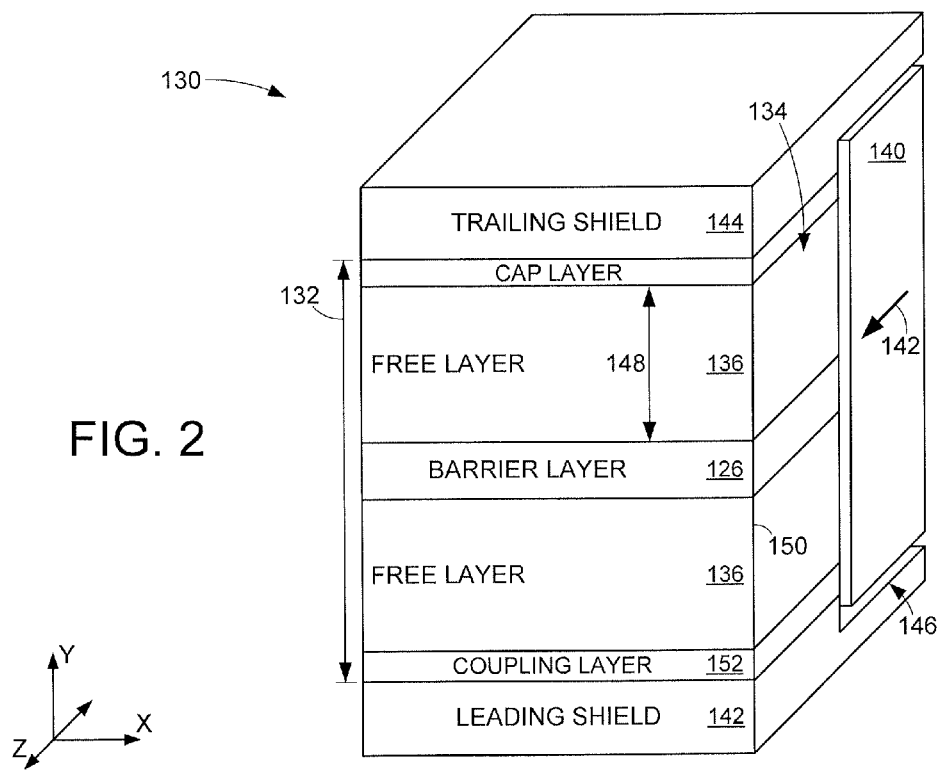
FIG. 2 shows an isometric block representation of a portion of an example data reader capable of being used in the data storage device of FIG. 1.

FIG. 2 provides an isometric block representation of an example data sensor 130 constructed and operated in accordance with various embodiments. It should be noted that while not required or limiting, the data sensor 130 may be incorporated into a rotating data medium data storage device, such as the data storage device 102 of FIG. 1. With an increase in data bit density on a data storage medium, like medium 112 of FIG. 1, the shield-to-shield spacing (SSS) 132 of the data sensor 130 plays and increasing role in the potential resolution of the data sensor 130, and consequently the speed and accuracy with which the sensor 130 can access data bits across an air bearing.

In an effort to reduce SSS 132, a trilayer magnetic stack 134 can be employed that is configured with dual magnetically free layers 136 separated by a barrier 126 or non-magnetic spacer layer. The lack of a fixed magnetization structure, such as an antiferromagnet (AFM) or synthetic antiferromagnet (SAF), in the magnetic stack 134 and on the air bearing surface (ABS) minimizes the SSS 132. The trilayer magnetic stack 132 operates, in various embodiments, by having each free layer 136 deviate from a predetermined default magnetization set by a detached biasing magnet 140 positioned distal the ABS. The deviation of the free layers 136 from the default magnetization in response to an external magnetic field, such as a data bit, produces a measurable magnetoresistance signal that is read as a logical state by associated local and remote protocol.

The configuration of the leading 142 and trailing 144 shields to provide reduced thickness notches 146, as measured along the Y axis, allows the bias magnet 140 to be thicker than the magnetic stack 134 and larger than the SSS 132 to provide a stable bias magnetization to the free layers 136 despite being separated from the stack 134 by non-magnetic insulating material. In contrast, a bias magnet 140 that is thinner than the magnetic stack 134 and SSS 132 can be more volatile magnetically and produce localized default magnetizations at the portions of magnetic stack 134 distal to the ABS, which can degrade free layer 136 response, accuracy, and readback voltage.

While the data sensor 130 can be tuned in an unlimited variety of manners to provide an endless array of structures with reduced SSS 132, reducing the thickness 148 of the free layers 136 can jeopardize the magnetic stability and performance of the material of the free layers 136. For example, slimming the free layer thickness 148 to a few nanometers may induce inadvertent magnetization switching along with magnetic strength that is insufficient to provide consistent response, and output voltage, to encountered data bits. Hence, minimized magnetic stack 134 physical dimensions operate with a thin tolerance margin for manufacturing fluctuations. That is, the magnetic stack 134, vertical shields 142 and 144, and lateral side shields (not shown) along the X axis can be individually and collectively tuned to optimize data sensor 130 performance, but inadvertent manufacturing fluctuations for the constituent layers of the trilayer magnetic stack 134 can reduce data bit reading accuracy and reliability.

The construction of some aspects of the trilayer magnetic stack 134, such as the continuously linear and vertical sidewalls 150 on the ABS, often correspond with material removal operations like side milling. Such side milling magnetic stack shaping operations may degrade magnetic performance of the trilayer stack 134 by changing the magnetization orientation of portions of the magnetic lamination, such as the magnetic coupling layer 152 positioned between the free layer 136 and the leading shield 142. Unwanted rotation of magnetization in the free layer 136 or coupling layer 152, such as into a plane not parallel to the ABS, can induce magnetic instability and noise into the magnetic stack 132 that detrimentally affects data sensor 130 performance by altering the free layer's 136 expected response to encountered external magnetic fields.

Figure 3:
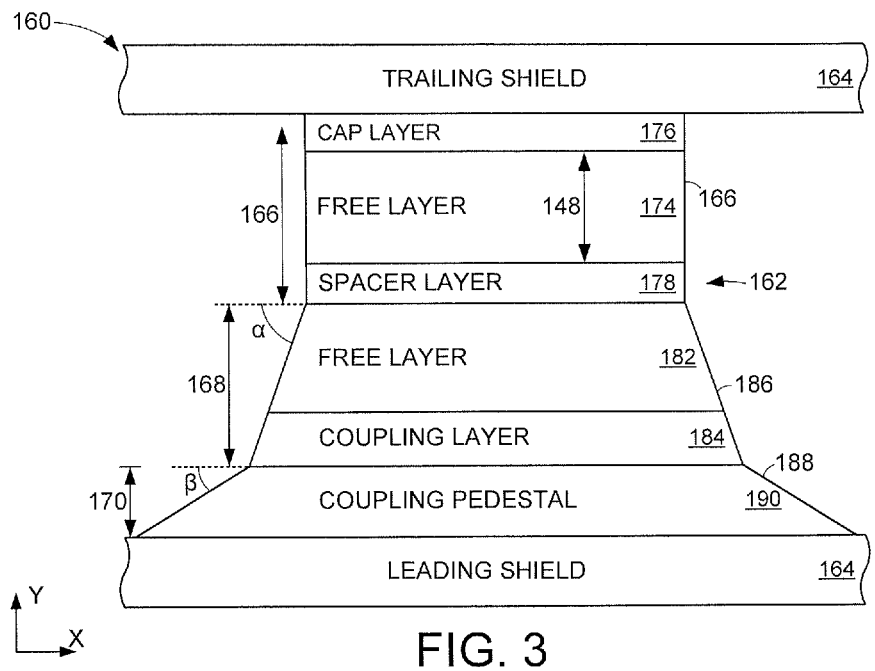
FIG. 3 displays an ABS view block representation of a portion of an example data reader configured in accordance with various embodiments.

The reduction in magnetic performance resulting from magnetic stack fabrication operations like side milling has rendered the example data reader 160 of FIG. 3 that is shown from an ABS as a non-limiting block representation. The data reader 160 is configured as a trilayer magnetic stack 162 disposed between vertical shields 164 and configured with first 166, second 168, and third 170 sidewall regions tuned to provide a predetermined magnetoresistive response across the non-magnetic spacer 172 with a reduced risk of inadvertent magnetization rotation in response to fabrication operations like side milling.

As displayed, the first magnetically free layer 174, cap 176, and spacer layer 178 comprise the first sidewall region 166 and are defined laterally by a pair of continuously linear sidewalls 180 that are each oriented vertically on the ABS and aligned along the Y axis. The vertical orientation of the sidewalls 180 of the first sidewall region 166 can deviate from absolute alignment with the Y axis, but are maintained within a 10° range from the longitudinal axis of the magnetic stack 162 and the Y axis in assorted embodiments to provide a magnetic extent of the first free layer 174 conducive to data bit resolution capable of sensing individual data bits in a high areal bit density data storage environment.

The second free layer 182 and adjacent magnetic coupling layer 184 comprise the second sidewall region 168, which has continuously linear sidewalls 186 that are each oriented at a non-normal angle (α) with respect to the cross-track X axis. Various embodiments tune the non-normal angle α to be in the range of 45°-60° with respect to the X axis to provide a side milling profile that reduces the chance of inadvertent magnetization rotation during magnetic stack 162 fabrication. However, the tuning of the sidewalls 186 of the second sidewall region 168 is conducted while aware of the potential for expansion of the magnetic extent of the magnetic stack 162 and unwanted side reading with the second free layer 182 being too wide, as measured along the X axis.

While the tuning of the second sidewall region 168 is cognizant of potential side reading consequences, tuning of the continuously linear sidewalls 188 of the coupling pedestal 190 to a predetermined angle (β) can be conducted without concern for enlarging the magnetic extent of the magnetic stack 162. As such, the predetermined angle β can be tuned, such as to 15°-45° with respect to the X axis, to be less than the sidewall angles of the first 166 and second 168 sidewall regions to minimize the risk for magnetization rotation during fabrication operations like side milling. The thickness of the coupling pedestal 190 may also be tuned, such as to be less than or equal to 5 nm, to provide predetermined coupling between the magnetic stack 162 and the leading vertical shield 164.

The combination of multiple different sidewall angles in the magnetic stack 162 allows the second free layer 182 to be stabilized by magnetic coupling to the vertical shield 164 via the coupling layer 184 and coupling pedestal 190. Although the tuned configuration of the respective sidewalls of the first 166, second 168, and third 170 sidewall regions can reduce the risk of manufacturing operations altering the magnetizations of the magnetic stack 162, the increased area of the second free layer 182 on the ABS compared to the first free layer 174 can affect the performance of the data reader 160. That is, free layers with matching areal extents, as defined as the thickness along the Y axis and width along the X axis, on the ABS corresponds with asymmetric magnetoresistance across the spacer layer 178 and possible inadvertent side reading of data bits from adjacent data tracks.

Figure 4:
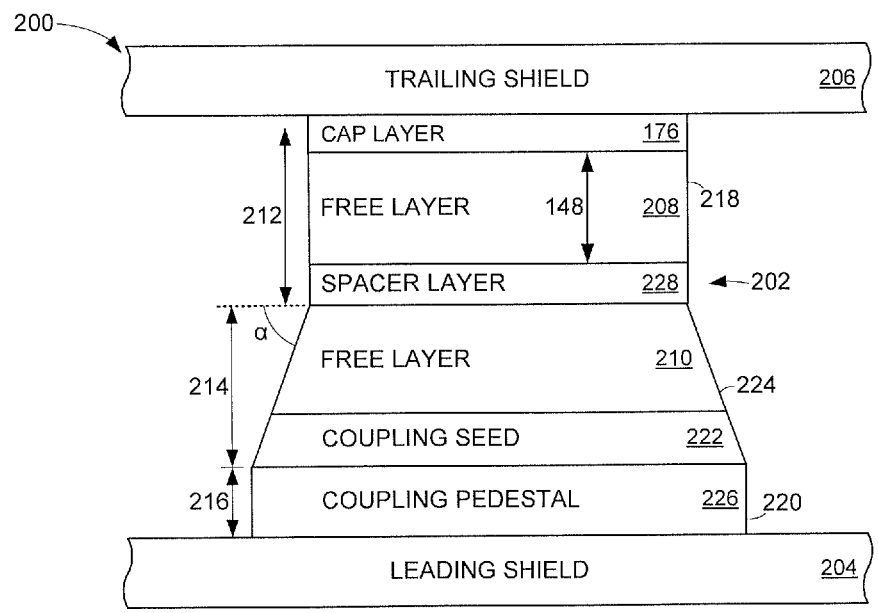
FIG. 4 illustrates an ABS view block representation of an example data sensor configured in accordance with assorted embodiments.

The non-limiting example data reader 200 of FIG. 4 illustrates an ABS view block representation of a portion of the data reader 200 configured to compensate for mismatched free layer areal extents while minimizing the effects of side milling during fabrication. As shown, the data reader 200 has a magnetic stack 202 contacting and disposed between leading 204 and trailing 206 shields that respectively extend beyond the width of either the first 208 or second 210 free layers of the magnetic stack 202 along the X axis. The magnetic stack 202 is configured with multiple different sidewall regions 212, 214, and 216 that are respectively associated with different, vertically stratified, portions of the magnetic stack 202.

The first 211 and third 216 sidewall regions are each tuned to have substantially vertical, continuously linear, sidewalls 218 and 220 that deviate less than 10° from the Y axis. Meanwhile, the second free layer 210 and adjacent coupling seed 222 each are horizontally bounded along the X axis by sidewalls 224 that are canted at a predetermined angle (α) with respect to the Y axis. Such canted sidewalls 224 provide horizontal separation of the sidewalls 220 of the coupling pedestal 226 and the sidewalls 218 of the spacer 228 and first free 208 layers so that side milling operations on the coupling pedestal 226 do not degrade the magnetization of the first 208 or second 210 free layers. In various embodiments, the angle (α) of sidewalls 224 is tuned to provide a minimum horizontal distance along the X axis at the ABS between the sidewalls 218 of the first sidewall region 212 and the sidewalls 220 of the second sidewall regions 216.

In comparison to the multiple different sidewall angles (α & β) shown in FIG. 3, the substantially vertical sidewalls 218 and 220 simplify manufacturing and allow for tuned magnetic coupling between the second free layer 210 and the leading shield 204 while reducing the effects of side milling on magnetic stack 202 magnetizations. For instance, the width of the coupling pedestal 226 along the X axis and corresponding areal extent on the ABS can be tuned to provide a predetermined amount of leading shield coupling that stabilizes the magnetic stack 202 without restricting magnetic rotation of the free layers 208 and 210 in response to encountered external data bits. However, a tuned coupling pedestal 226 may not be sufficient to stabilize magnetic stack 202 magnetizations while correcting for asymmetric free layer areal extents on the ABS that can lead to side reading and degraded performance.

Figure 5:
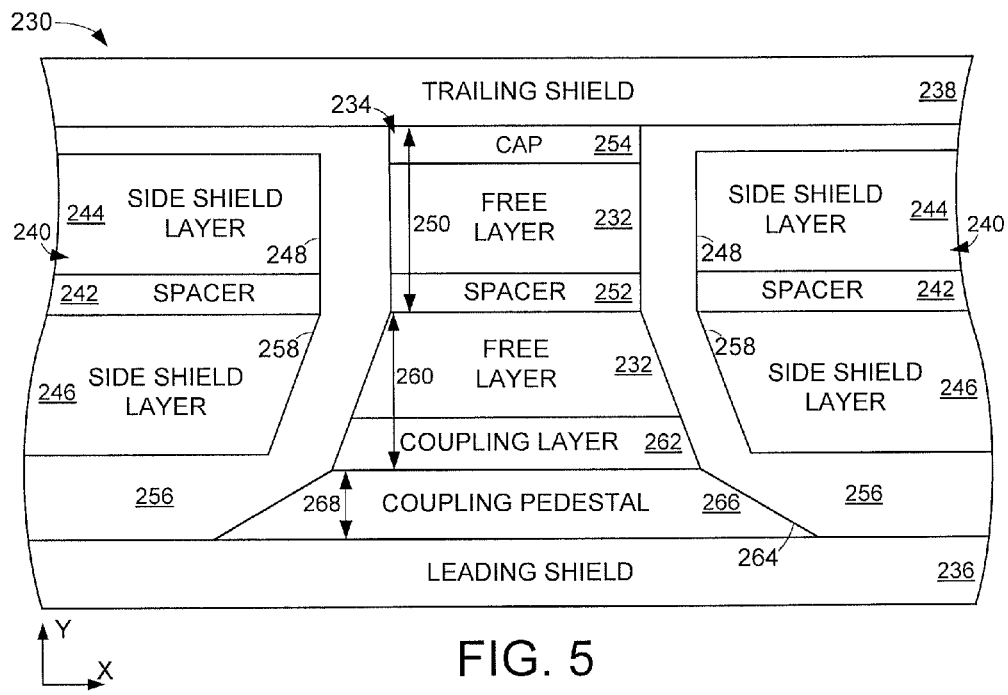
FIG. 5 is an ABS view block representation of a portion of an example data reader constructed and operated in accordance with various embodiments.

FIG. 5 is an ABS view block representation of an example data sensor 230 configured in accordance with various embodiments to minimize side milling magnetization degradation and optimize performance from mismatched free layer areal extents on the ABS. While small surface width mismatches, such as less than or equal to 5 nm, on the ABS along the Y axis between magnetic free layers 232 of a magnetic stack 234 may be compensated for by adjusting lithography and milling fabrication of the magnetic stack 234 and vertically adjacent leading 236 and trailing 238 shields, such manufacturing operations can be imprecise and jeopardize the magnetization of the free layers 232, as previously discussed.

The incorporation of tuned side shields 240 on opposing horizontal sides of the magnetic stack 234 along the X axis allows predetermined magnetizations to be arranged proximal each free layer 232 on the ABS, which provides increased magnetic stability as well as a more exact magnetic extent for the magnetic stack 234. That is, one or both side shields 240 can be tuned for material, size, and position to provide a magnetization that aids in maintaining a default magnetization in the free layers 232 and defining a magnetic reading extent that compensates for the increased surface width of one of the free layers 232.

In the non-limiting tuned side shields 240 of FIG. 5, a non-magnetic spacer layer 242 is disposed between trailing 244 and leading 246 side shield layers. The trailing side shield 244 and spacer layers 242 share a continuously linear sidewall 248 that matches, within at least 5°, of the magnetic stack sidewall region 250 that corresponds with the trailing free layer 232, non-magnetic stack spacer 252, and cap 254. The position and thickness of the trailing side shield layer 244 of the side shield 240 along the Y axis can be tuned in relation to the trailing free layer 232 of the magnetic stack 234 to control the shielding and magnetic influence of the side shield 240 on the stack free layers 232.

Tuning of the side shields 240 may further balance the distance between the magnetic stack 234 and the side shield 240 that is filled with non-magnetic insulating material 256. In other words, the horizontal distance along the X axis between the trailing side shield layer 248 of the side shield 240 and the trailing free layer 232 of the magnetic stack 234 can be set to be a continuously uniform value that balances magnetic biasing with magnetic shielding of the side shield 240 on the magnetic stack 234. The tuned sidewall configuration of the magnetic stack 234 can be accommodated by similarly tuning a leading side shield sidewall 258 of the side shield 240 in relation to the leading stack sidewall region 260, which continuously extends from the leading free layer 232 to the coupling layer 262 of the magnetic stack 234. The sidewall angles in the leading side shield layer 246 of the side shield 240 and the magnetic stack 232 are not limited to similar orientations as a varying insulating material 256 distance between the shield 240 and stack 234 can provide control of the horizontal magnetic extent of the data sensor 230.

The side shield 240 may extend vertically beyond either sidewall region 250 and 260 of the magnetic stack 234, but in some embodiments does not extend beyond the coupling layer 262, as shown. As such, the leading side shield layer 246 of the side shields 240 does not have a sidewall tuned in a similar orientation to the pedestal sidewall 264 of the coupling pedestal 266 of the magnetic stack 234. The high incident angle of the pedestal sidewall 266 of the third sidewall region 268 of the magnetic stack 234 can be complex and imprecise to construct to match with a side shield sidewall. Hence, the side shield 240 provides a uniform insulating material 256 width along the sidewall regions 250 and 260 of the magnetic stack 234 without extending to be horizontally adjacent the pedestal sidewall 264.

However, various embodiments do extend the leading side shield layer 246 of the side shield 240 horizontally adjacent at least a portion of the coupling pedestal 266 and configures the shield sidewall 258 to have multiple different linear surfaces to substantially match the sidewall angles of sidewall regions 260 and 268. With the unlimited variety of side shield configurations that may or may not correspond with the orientation of the magnetic stack 234 sidewalls, performance of the data sensor 230 can be optimized as the multiple different sidewall angles of regions 250, 260, and 268 reduce the impact of side milling on magnetic stabilization while the tuned side shields 240 reduce the risk of expanded magnetic stack extent by compensating for mismatched free layer width in the magnetic stack 232.

The use of single layer or laminated side shields 240 can provide greater tuning options and optimized sensor 230 performance. The presence of the side shields 240 does not preclude the ability to tune the in-plane anisotropy of the coupling pedestal 266 and coupling layer 262 to provide a leading free layer 232 magnetization orientation that is canted with respect to the X axis and cross-track direction at a predetermined angle, such as at least 15°. While the formation and tuning of the in-plane anisotropy of the pedestal 266 and coupling layer 262 are not limited, assorted embodiments construct the layers out of CoFe based materials formed with oblique incident angle deposition operations that create anisotropy as large as 1000 Oe.

It should be noted that tuning a high in-plane anisotropy in the pedestal 266 can influence the tuned configuration of the coupling layer 262 and side shields 240 to provide a predetermined amount of RKKY coupling between the free layers 232 of the magnetic stack 234 and the leading shield 236. A non-limiting tuned configuration provides an RKKY coupling strength of −0.3 erg/cm$^2$ to −0.8 erg/cm$^2$ by adjusting the coupling layer material and thickness along the Y axis along with the width of the leading free layer 232. Assorted embodiments further tune the cap 254 to provide RKKY coupling between the trailing free layer 232 and the trailing shield 238. Such a cap 254 configuration may comprise a lamination of layers, similarly or dissimilarly constructed like the coupling layer 262 and pedestal 266, that have a width along the X axis at the ABS that is larger than the free layers 232.

Figure 6:
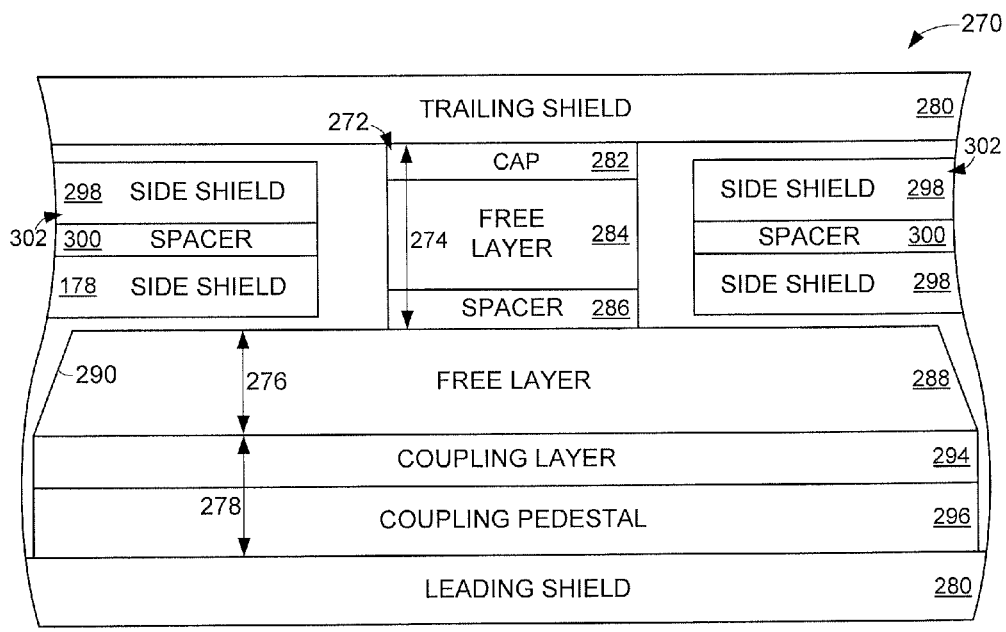
FIG. 6 shows an ABS view block representation of an example data reader configured in accordance with some embodiments.

FIG. 6 generally illustrates an ABS view block representation of an example data reader 270 constructed in accordance with some embodiments to have uniaxial anisotropy in combination with a predetermined RKKY coupling strength.

The data reader 270 has a magnetic stack 272 configured with a first 274, second 276, and third 278 sidewall regions between vertical shields 280. The first sidewall region 274 comprises a cap 282, free layer 284, and non-magnetic spacer 286 each having a first width as measured along the X axis while the second sidewall region 276 comprises leading free layer 288 that has a greater second width along the X axis and a sidewall 290 angled with respect to the substantially vertical sidewall of the first sidewall region 274. The larger width for the leading free layer 288 can allow for large uniaxial anisotropy that maintains a stable default magnetization state when biased by one or more of the vertical shields 280, side shields 292, and rear bias magnet, such as magnet 140 of FIG. 2.

The angled sidewall 290 of the second sidewall region 276 may continuously extend to a coupling layer 294, as displayed in FIG. 5, or the coupling layer 294 can have a differently angled pair of sidewalls that continuously extend to the coupling pedestal 296 as part of the third sidewall region 276 as shown in FIG. 6. The leading free layer 288 can be tuned for thickness, material, width, and sidewall angle to operate in concert with the free 298 and non-magnetic spacer 300 layers of the side shields 302 to set the default magnetization directions for the free layers 284 and 288 that is symmetric and canted with respect to the cross-track direction on the ABS defined by the X axis. The leading free layer 288 may also be tuned with respect to the magnetic coupling strength to be present between the magnetic stack 272 and leading shield 280, which may also contribute to the stabilization and establishment of the symmetric and canted free layer default magnetizations.

The diverse variety of magnetic stack configurations possible through the tuning of various portions of a data reader allow for the magnetic structure and operation of a magnetic stack to have increased data bit linear resolution that can accommodate an array of different data storage environments. The example data reader fabrication routine 310 of FIG. 7 can be carried out in accordance with various embodiments to tune a magnetic stack to accommodate a variety of data storage environments. The routine 310 may begin with step 312 by forming a leading shield on a substrate. The leading shield may be formed by an unlimited number of deposition operations and of an unlimited number of materials that have a predetermined width and thickness on an ABS.

Step 314 next deposits a coupling pedestal and layer successively atop the leading shield. The deposition of the pedestal and coupling layer may be constructed individually or collectively of similar or dissimilar materials and deposition operations, but in assorted embodiments each are formed of CoFe type magnetic materials having a uniaxial anisotropy above 500 Oe. The deposition of step 314 is followed by decision 316 where the sidewalls of the respective portions are evaluated to determine if different angles are to be constructed. If different sidewall angles are not to be formed, step 318 removes material from both the pedestal and coupling layer to form a continuously linear sidewall angle, such as sidewall 224 of FIG. 4. The process of removing material to form the predetermine angle is not required to be side milling, but milling operations are conducted at least in part in some embodiments.

In the event different sidewall angles are to be formed, step 320 mills the coupling pedestal to have a pair of sidewalls angled with respect to the longitudinal axis of the designed magnetic stack. The formation of the sidewalls in either step 318 or step 320 advances routine 310 to step 322 where a leading free layer is deposited on the coupling layer. A design with different coupling pedestal and coupling layer sidewall angles proceeds to mill the sidewalls of the free and coupling layers to a predetermined second angle in step 324. Alternatively, the free layer alone can be configured with sidewalls oriented at a second sidewall angle in step 326, which would produce a sidewall structure similar to that shown in FIG. 6.

The tuning of the leading free layer, coupling layer, and coupling pedestal then allows the non-magnetic spacer, trailing free layer, and cap to be successively formed in step 328 to complete the magnetic stack deposition. Next, step 330 removes portions of the spacer, trailing free layer, and cap to provide a predetermined width on the ABS and shape the respective sidewalls to a particular, continuously linear, orientation, such as substantially vertical. Shaping the remaining portions of the magnetic stack in step 330 provides a functional data sensor that can be shielded from external magnetic fields by a trailing shield deposited in step 332.

Figure 7:
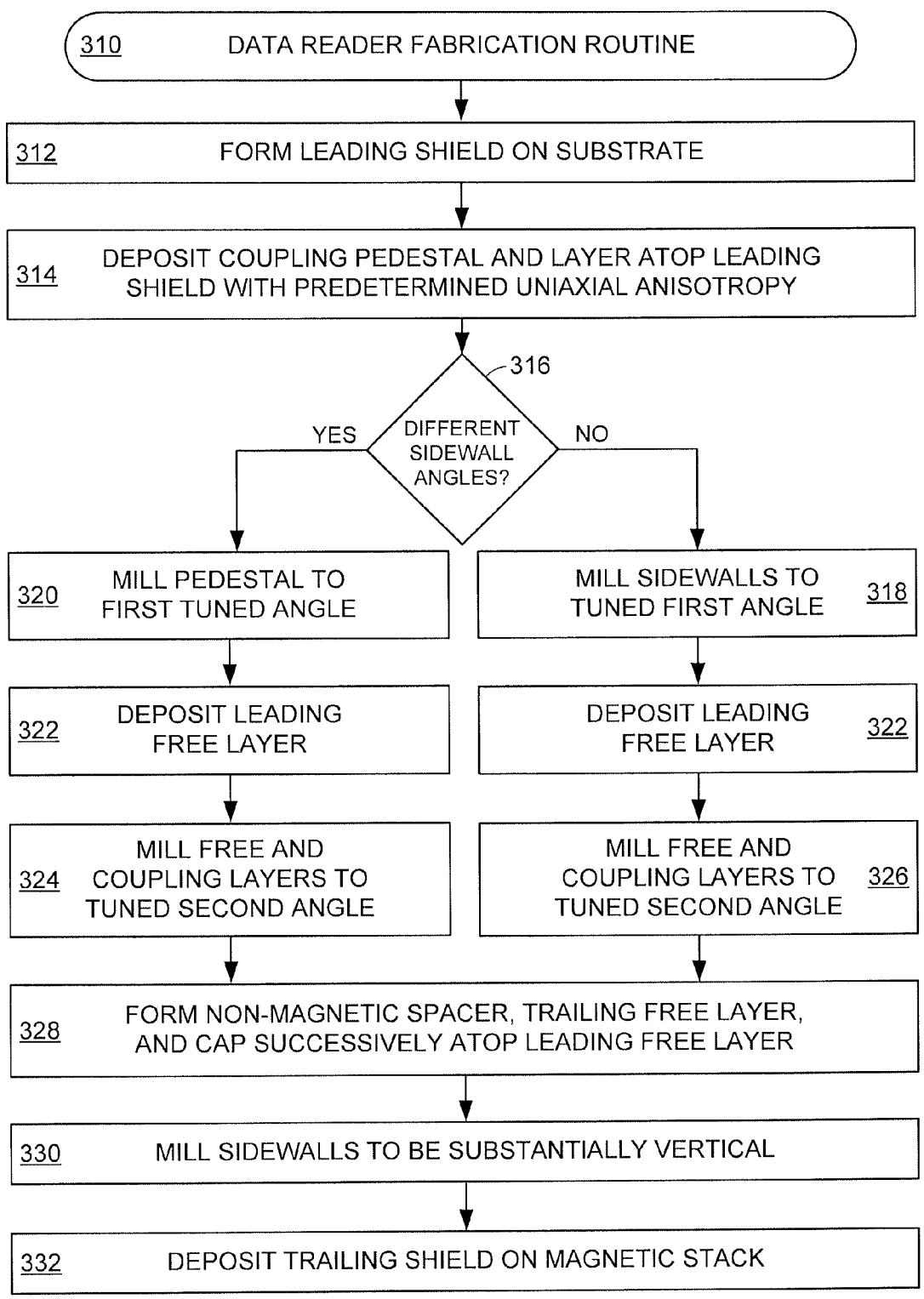
FIG. 7 provides a flowchart of a data reader fabrication routine carried out in accordance with various embodiments.

While a functioning data sensor can be constructed from routine 310 with a plethora of tuned aspects, like anisotropy and sidewall angles, the routine 310 is not limited to the steps and decision shown in FIG. 7. For instance, at least one side shield comprising a single layer or lamination of layers can be formed in conjunction with or subsequent to the formation of the magnetic stack. Routine 310 may further have steps that shape the sidewalls of the at least one side shield to provide a uniform or varying reading gap defined by the distance between magnetic stack and side shield sidewalls, as generally illustrated in FIGS. 5 and 6.

Through the tuning of various portions of a magnetic stack and side shields, a data reader can be constructed that operates with optimized performance in the form of signal-to-noise ratio and linear data bit resolution. The tuned sidewall orientations of the stratified portions of the magnetic stack allow side milling operations to have minimal impact on free layer magnetizations. Such tuned sidewalls can be complemented by the tuned magnetic coupling provided by the coupling pedestal and coupling layer. Furthermore, the ability to tune side shields and magnetic anisotropy in a data reader can stabilize default magnetization orientation to increase response and resolution to encountered external data bits.

It should be noted that while the embodiments herein have been directed to structures capable of reading data bits on a rotating data medium, it will be appreciated that the various embodiments can readily be utilized in any number of other applications, including solid-state memory devices and cloud computing environments. It is to be understood that even though numerous characteristics and configurations of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. An apparatus comprising a magnetic stack having a first magnetic layer separated from a second magnetic layer by a non-magnetic spacer layer, the first magnetic layer having an areal extent on an air bearing surface (ABS) that differs from the second magnetic layer, the second magnetic layer coupled to a magnetic shield via a coupling pedestal and configured with a first plurality of linear sidewalls each angled with respect to a second plurality of linear sidewalls of the first magnetic layer, the coupling pedestal having a third plurality of linear sidewalls angled differently than the first and second pluralities of linear sidewalls.

2. The apparatus of claim 1, wherein the first and second magnetic layers each comprise a free magnetization sensitive to an external magnetic field.

3. The apparatus of claim 1, wherein the second magnetic layer has a greater width on the ABS than the first magnetic layer.

4. The apparatus of claim 3, wherein the second magnetic layer has a greater in-plane anisotropy than the first magnetic layer.

5. The apparatus of claim 3, wherein the first and second magnetic layers have different thicknesses as measured orthogonally compared to the respective widths.

6. The apparatus of claim 1, wherein the coupling pedestal has a thickness of 5 nm or less, the thickness oriented parallel to a shield-to-shield spacing of the magnetic stack.

7. The apparatus of claim 1, wherein a coupling layer is disposed between the coupling pedestal and the second magnetic layer to provide RKKY coupling between the second magnetic layer and the coupling pedestal.

8. The apparatus of claim 1, wherein each linear sidewall of the third plurality of linear sidewalls laterally extends beyond a side shield sidewall of a side shield.

9. The apparatus of claim 1, wherein each linear sidewall of the third plurality of linear sidewalls is angled at a greater angle with respect to a longitudinal axis of the magnetic stack than each linear sidewall of the first and second pluralities of linear sidewalls.

10. The apparatus of claim 1, wherein each linear sidewall of the first plurality of linear sidewalls is angled at 0° with respect to a longitudinal axis of the magnetic stack, each linear sidewall of the second plurality of linear sidewalls is angled at 45° with respect to the longitudinal axis, and each linear sidewall of the third plurality of linear sidewalls is angled at 60° with respect to the longitudinal axis.

11. The apparatus of claim 1, wherein the coupling pedestal comprises a third plurality of linear sidewalls, each linear sidewall of the first and third pluralities of linear sidewalls angled at a common angle with respect to a longitudinal axis of the magnetic stack.

12. A data reader comprising:
a trilayer magnetic stack;
a first free magnetic layer of the trilayer magnetic stack having a first areal extent on an air bearing surface (ABS) defined by a first thickness and a pair of first linear sidewalls; and
a second free magnetic layer separated from the first free magnetic layer in the trilayer magnetic stack by a non-magnetic spacer layer, the second free magnetic layer coupled to a magnetic shield via a coupling pedestal and configured with a second areal extent that differs from the first areal extent due to a second pair of linear sidewalls each angled with respect to the respective first linear sidewalls, the coupling pedestal having a third plurality of linear sidewalls angled differently than the first and second pluralities of linear sidewalls.

13. The data reader of claim 12, wherein the trilayer magnetic stack is disposed vertically between leading and trailing shields and disposed horizontally between first and second side shields.

14. The data reader of claim 13, wherein the first and second side shields are each laminations of multiple shield sub-layers.

15. The data reader of claim 14, wherein each linear sidewall of the second pair of linear sidewalls are angled to match a first linear sidewall of a first shield sub-layer, the first linear sidewall facing the trilayer magnetic stack.

16. The data reader of claim 15, wherein each linear sidewall of the first pair of linear sidewalls are angled to match a second linear sidewall of a second shield sub-layer, the second linear sidewall facing the trilayer magnetic stack.

17. The data reader of claim 14, wherein the multiple shield sub-layers have opposing magnetizations configured to provide orthogonally oriented default magnetizations in the respective first and second free magnetic layers.

18. The data reader of claim 12, wherein each linear sidewall of the first and second pair of linear sidewalls are continuously linear at a predetermined angle with respect to a longitudinal axis of the trilayer magnetic stack.

19. A method comprising:
separating a first magnetic layer from a second magnetic layer by a non-magnetic spacer layer in a magnetic stack, the first magnetic layer having an areal extent on an air bearing surface (ABS) that differs from the second magnetic layer;
coupling the second magnetic layer to a magnetic shield via a coupling pedestal;
tuning the second magnetic layer to have a first plurality of linear sidewalls each angled with respect to a second plurality of linear sidewalls of the first magnetic layer; and
configuring the coupling pedestal with a third plurality of linear sidewalls angled differently than the first and second pluralities of linear sidewalls.

20. The method of claim 19, further comprising positioning the coupling pedestal between the magnetic shield and the second magnetic layer, the third plurality of linear sidewalls each having a greater angles with respect to a longitudinal axis of the magnetic stack than the first and second pluralities of linear sidewalls.

* * * * *